(12) United States Patent
Park et al.

(10) Patent No.: US 9,362,364 B2
(45) Date of Patent: Jun. 7, 2016

(54) TRANSFER-FREE BATCH FABRICATION OF SINGLE LAYER GRAPHENE DEVICES

(75) Inventors: Jiwoong Park, Ithaca, NY (US); Carlos Ruiz-Vargas, Ithaca, NY (US); Mark Philip Levendorf, Chesterland, OH (US); Lola Brown, Ithaca, NY (US)

(73) Assignee: CORNELL UNIVERSITY, Ithaca, NY (US)

(*) Notice: Subject to any disclaimer, the term of this patent is extended or adjusted under 35 U.S.C. 154(b) by 46 days.

(21) Appl. No.: 13/384,663

(22) PCT Filed: Jul. 21, 2010

(86) PCT No.: PCT/US2010/042702
§ 371 (c)(1),
(2), (4) Date: Mar. 26, 2012

(87) PCT Pub. No.: WO2011/046655
PCT Pub. Date: Apr. 21, 2011

(65) Prior Publication Data
US 2012/0168724 A1    Jul. 5, 2012

Related U.S. Application Data

(60) Provisional application No. 61/227,241, filed on Jul. 21, 2009.

(51) Int. Cl.
*H01L 21/20* (2006.01)
*H01L 29/16* (2006.01)
(Continued)

(52) U.S. Cl.
CPC ........ *H01L 29/1606* (2013.01); *H01L 21/8258* (2013.01); *H01L 27/1207* (2013.01);
(Continued)

(58) Field of Classification Search
CPC ............... H01L 29/1606; H01L 21/02527; H01L 21/02376; C01B 2204/02; C01B 2204/04; C01B 31/04; C01B 31/043; Y10T 428/30; Y10T 29/417; Y10T 428/261; Y10T 428/2982; B82Y 30/00; B82Y 40/00; B82Y 10/00; Y10S 977/742
USPC ........ 257/507, E21.041, E29.082, 29, 76, 40; 438/478, 507, 99
See application file for complete search history.

(56) References Cited

U.S. PATENT DOCUMENTS 5,397,713 A * 3/1995 Hamamoto et al. ............ 438/97
2002/0028392 A1 * 3/2002 Jin et al. ........................ 430/5
(Continued)

OTHER PUBLICATIONS

Lee, Byul Sup; International Search Report and Written Opinion; Jun. 15, 2011; Korean Intellectual Property Office, Government Complex, Daejeon, 189 Cheongsa-ro, Seo-gu, Daejeon 302-701, Republic of Korea.

*Primary Examiner* — Su C Kim
*Assistant Examiner* — Junaiden Mirsalahuddin
(74) *Attorney, Agent, or Firm* — William Greener; Alek P. Szecsy; Bond, Schoeneck & King, PLLC

(57) ABSTRACT

A method of manufacturing one or more graphene devices is disclosed. A thin film growth substrate is formed directly on a device substrate. Graphene is formed on the thin film growth substrate. A transistor is also disclosed, having a device substrate and a source supported by the device substrate. The transistor also has a drain separated from the source and supported by the device substrate. The transistor further has a single layer graphene (SLG) channel grown partially on and coupling the source and the drain. The transistor also has a gate aligned with the SLG channel, and a gate insulator between the gate and the SLG channel. Integrated circuits and other apparati having a device substrate, a thin film growth substrate formed directly on at least a portion of the device substrate, and graphene formed directly on at least a portion of the thin film growth substrate are also disclosed.

47 Claims, 11 Drawing Sheets

(51) Int. Cl.
  *H01L 21/8258* (2006.01)
  *H01L 27/12* (2006.01)
  *H01L 29/417* (2006.01)
  *H01L 29/778* (2006.01)
  *H01L 29/786* (2006.01)

(52) U.S. Cl.
  CPC ...... *H01L29/41733* (2013.01); *H01L 29/7781* (2013.01); *H01L 29/78603* (2013.01); *H01L 29/78645* (2013.01); *H01L 29/78648* (2013.01); *H01L 29/78684* (2013.01)

(56) References Cited

U.S. PATENT DOCUMENTS

| | | | |
|---|---|---|---|
| 2007/0187694 A1* | 8/2007 | Pfeiffer | 257/76 |
| 2009/0110627 A1* | 4/2009 | Choi et al. | 423/447.1 |
| 2009/0140801 A1 | 6/2009 | Ozyilmaz et al. | |
| 2009/0169919 A1 | 7/2009 | Garcia et al. | |
| 2010/0021708 A1* | 1/2010 | Kong | B82Y 30/00 428/220 |
| 2010/0032409 A1* | 2/2010 | Hong et al. | 216/41 |
| 2010/0051897 A1* | 3/2010 | Chen | B82Y 10/00 257/9 |

* cited by examiner

TRANSFER-FREE BATCH FABRICATION OF SINGLE LAYER GRAPHENE DEVICES

RELATED APPLICATIONS

This application claims priority to U.S. provisional patent application Ser. No. 61/227,241, filed Jul. 21, 2009, and entitled "TRANSFER-FREE BATCH FABRICATION OF SINGLE LAYER GRAPHENE DEVICES". Provisional U.S. patent application Ser. No. 61/227,241 is hereby incorporated by reference in its entirety.

GOVERNMENT FUNDING

This invention was made with Government support under Grant Number N66001-08-1-1974 awarded by DOD-DARPA and under Grant Number FA9550-09-1-0691 awarded by Air Force Office of Scientific Research. The United States Government has certain rights in the invention.

FIELD

This technology relates to devices fabricated with single layer graphene, and more specifically to the transfer-free batch fabrication of single layer graphene devices.

BACKGROUND

Graphene is a one-atom-thick planar sheet of bonded carbon atoms that are densely packed in a honeycomb crystal lattice. Graphene can be visualized as an atomic-scale two-dimensional wire mesh made of carbon atoms and their bonds. Since the reports of its first isolation and the observation of the quantum Hall effect, single layer graphene (SLG) has attracted intense research efforts both from academic and industrial communities. Based on the discovered properties and behaviors of SLG, the possible incorporation of SLG into devices such as integrated circuits offers potential benefits in terms of further miniaturization, increased operating speeds, lower power requirements, and reduced operating temperatures.

Graphene can be produced through mechanical exfoliation of graphite. In one example of an exfoliation method, graphite is repeatedly exfoliated using scotch tape to remove increasingly thinner graphite crystals until graphene is eventually adhered to the tape. While the original exfoliation method led to many exciting discoveries regarding this unique two dimensional atomic crystal, exfoliated graphene has unfortunately proven difficult to integrate into large scale production of conventional electronic, mechanical, and optoelectronic circuitry.

Several alternative synthesis methods have been reported to try to produce graphene with desirable physical properties similar to those of exfoliated SLG, with minimal spatial variation, over extended areas. These alternatives include epitaxial growth of graphene out of silicon, reduction of graphene oxide, direct growth of graphene onto thin nickel film, and most recently, direct growth onto copper foils. Among these methods, the copper foil-based synthesis has been the most effective in producing large areas of continuous SLG with promising electrical properties including a carrier mobility of ~4000 cm2/V·s. The nickel based synthesis also showed excellent physical properties, most notably the quantum Hall effect, and it has been shown that further optimization leads to the formation of 87% single or double layer graphene in area. Unfortunately, using these graphene materials for device applications requires a transfer step because the growth substrate is not compatible with device fabrication procedures. Furthermore, this extra transfer step for depositing synthesized graphene onto a device substrate can cause a number of significant problems. First, the large area SLG is mechanically delicate can easily be damaged during the transfer, resulting in a high defect rate. Second, alignment between the graphene film and the target substrate presents additional technical challenges potentially resulting in the need for increased tolerances that sacrifice device density and/or can result in increased defect rates. Third, these transfer procedures are often performed in aqueous solutions and it is difficult to remove the liquid residue trapped within the interfacial space between graphene and the target substrate, resulting in unwanted spatial variation and still further defects.

Therefore, it would be desirable to have a reliable, transfer-free method for batch fabrication of single layer graphene devices with physical properties similar to those of exfoliated SLG, and with minimal spatial variation over extended areas.

SUMMARY

A method of manufacturing one or more graphene devices is disclosed. A thin film growth substrate is formed directly on a device substrate. Graphene is formed on the thin film growth substrate.

A transistor is also disclosed. The transistor has a device substrate and a source supported by the device substrate. The transistor also has a drain separated from the source and supported by the device substrate. The transistor further has a single layer graphene (SLG) channel grown partially on and coupling the source and the drain. The transistor also has a gate aligned with the SLG channel. The transistor further has a gate insulator between the gate and the SLG channel.

An integrated circuit is also disclosed. The integrated circuit has a device substrate and a plurality of transistors. Each of the plurality of transistors includes: a source supported by the device substrate; a drain separated from the source and supported by the device substrate; a single layer graphene (SLG) channel grown partially on and coupling the source and the drain; a gate aligned with the SLG channel; and a gate insulator between the gate and the SLG channel.

A fabrication method is further disclosed. At least a part of an assembly is covered with at least a single layer of graphene. The assembly is subjected to at least one chemically active environment such that the part of the assembly covered with the at least single layer of graphene is protected from the at least one chemically active environment by the at least single layer of graphene while the at least one chemically active environment reacts with an uncovered portion of the assembly. After subjecting the assembly to the at least one chemically active environment, at least a portion of the at least single layer of graphene is removed.

The embodiments of transfer-free batch fabrication for single layer graphene devices disclosed herein, and their embodiments, are compatible with standard thin film technologies and do not involve delicate steps such as liquid based transfer. Thus, the disclosed methods enable SLG to be integrated into large scale electronics circuitry using economical, reliable, and process-compatible modifications to existing fabrication processes that can easily be streamlined and automated.

BRIEF DESCRIPTION OF THE DRAWINGS

FIG. 4A-1 shows a magnified picture of graphene growth on prior art copper foils.

FIG. 4A-2 shows a magnified picture of graphene growth on an embodiment of a thin film growth substrate in accordance with the manufacturing method discussed with regard to FIG. 1.

Figure 1:
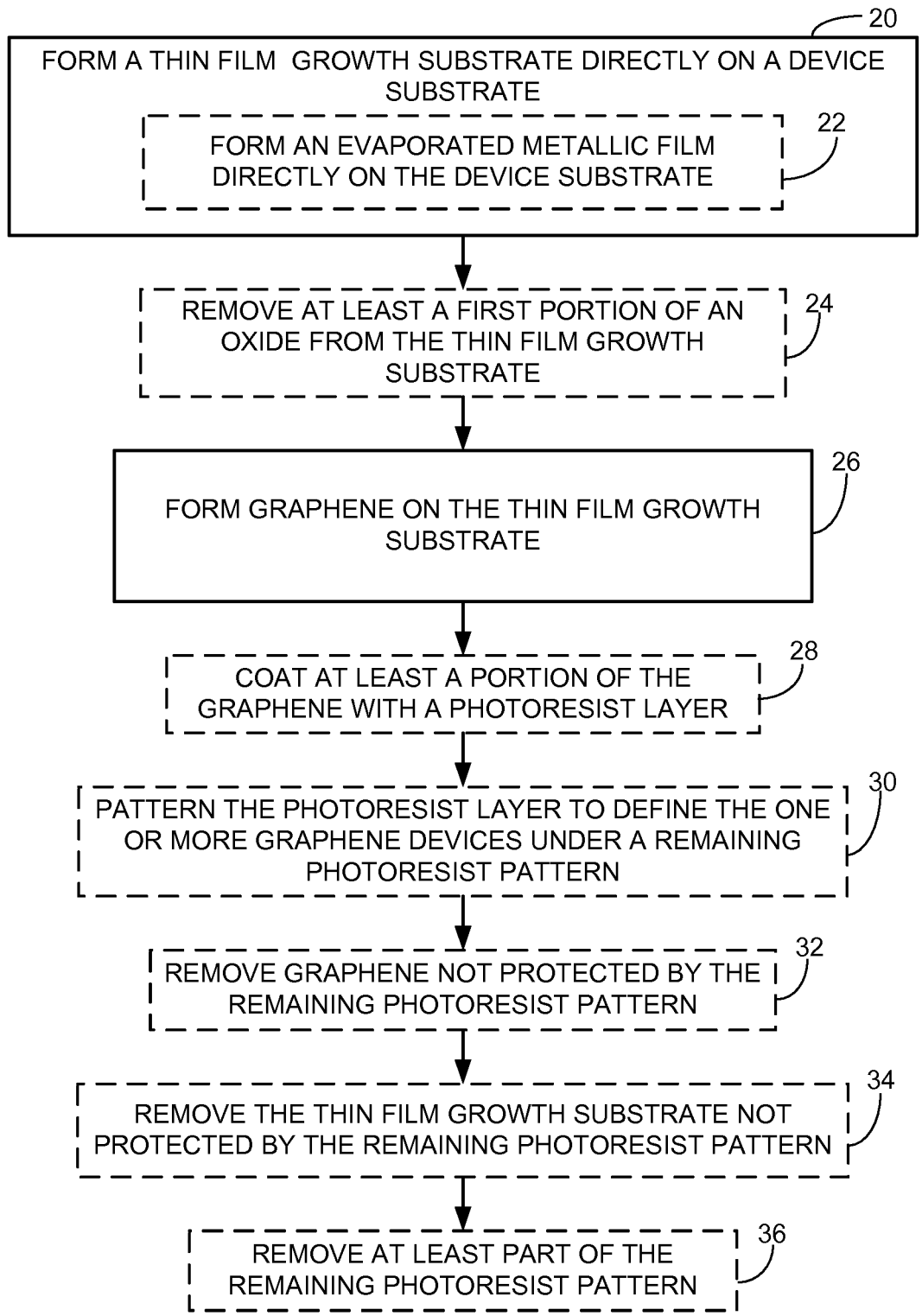
FIG. 1 illustrates an embodiment of a method of manufacturing one or more graphene devices.

It will be appreciated that for purposes of clarity and where deemed appropriate, reference numerals have been repeated in the figures to indicate corresponding features. Illustrations are not necessarily drawn to scale. While the transfer-free batch fabrication of single layer graphene devices is described herein by way of example for several embodiments and illustrative drawings, those skilled in the art will recognize that the system and method are not limited to the embodiments or drawings described. It should be understood, that the drawings and detailed description thereto are not intended to limit embodiments to the particular form disclosed. Rather, the intention is to cover all modifications, equivalents and alternatives falling within the spirit and scope of the appended claims. Any headings used herein are for organizational purposes only and are not meant to limit the scope of the description or the claims. As used herein, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

FIG. 1 illustrates an embodiment of a method of manufacturing one or more graphene devices. In step 20, a thin film growth substrate is formed directly on a device substrate. The device substrate may, but is not limited to, a variety of materials such as silicon, a semiconductor, glass, fused silica, quartz, sapphire, or metal. The device substrate may include more than one layer. For example, the device substrate may include an insulating layer, such as a thermal oxide. The thin film growth substrate formed directly on the device substrate may be formed, for example, by evaporating 22 a metallic film directly on the device substrate. Other techniques may be used to form the thin film growth substrate directly on the device substrate, for example, but not limited to sputtering and electroplating. The thin film growth substrate may be, but is not limited to copper, nickel, cobalt, ruthenium, iridium, or a transition metal. In some embodiments, the thin film growth substrate may include an adhesion layer. As just one example, a copper thin film growth substrate deposited by evaporation directly onto the device substrate may also have a nickel adhesion layer. In some embodiments, the formed thin film growth substrate may have a thickness of at least approximately 100 nanometers, but other embodiments may use thinner or thicker thin film growth substrates. The thin film growth substrate does not need to be a continuous film. In some embodiments, the thin film growth substrate include a plurality of thin film growth substrate areas which are not continuous with each other. Furthermore, in some embodiments, the thin film growth substrate may have a prepatterned structure. The prepatterned structure may be one continuous structure or may include a plurality of structures.

Depending on the manufacturing environment and or handling steps for the device substrate with formed thin film growth substrate, a metallic oxide may form on the thin film growth substrate. Optionally, in step 24, at least a first portion of a metallic oxide is removed from the thin film growth substrate prior to any ensuing heating or growth steps. The at least first portion of the metallic oxide may be removed, for example, by immersing the thin film growth substrate in an acidic reagent configured to react with and remove oxygen atoms from the metallic oxide. A suitable non-limiting reagent for removing oxygen atoms is acetic acid. Even though metallic oxides could be stripped in under a reaction environment, removal prior to growth eliminates the need for a lengthy anneal which can deteriorate the quality of the thin film growth substrate. In further embodiments, at least a second portion of the metallic oxide may be removed from the thin film growth substrate by heating the thin film growth substrate in an environment comprising hydrogen, for example during a heating ramp-up prior to ensuing growth steps.

In step 26, graphene is formed directly on the thin film growth substrate. As one non-limiting example, graphene may be formed on the thin film growth substrate in a chemical vapor deposition (CVD) process. Although not necessary, preferably, the graphene formed on the thin film growth substrate is a substantially single layer of graphene on the thin film growth substrate. Suitable process conditions for growing a substantially single layer of graphene on the thin film growth substrate are disclosed further in this specification, and variations and alternates will be apparent to those skilled in the art and are intended to be included in this disclosure.

In some embodiments, at this point, the process may be complete, for example, if it is not desired to pattern the graphene layer formed on the thin film growth substrate, or if the thin film growth substrate was already pre-patterned. In other embodiments, however, it may be desirable to remove one or more portions of the graphene and/or the thin film growth substrate. Optional steps 28-36 illustrate one possible way the graphene and thin film growth layer could be patterned to define one or more graphene devices according to some embodiments.

In step 28, a least a portion of the graphene is coated with a photoresist layer. The photoresist layer may be a light and/or electron beam sensitive material which, when exposed forms a protective coating in either the light or electron-beam exposed areas or in the unexposed areas, depending on whether a positive or negative photoresist is used. In step 30, the photoresist layer is patterned, for example by electron beam or light exposure, to define one or more graphene devices under a remaining photoresist pattern. Areas of the photoresist which do not form a protective coating are easily dissolved, for example, by a photoresist developer, to leave the remaining photoresist pattern. The remaining photoresist pattern can define one or more graphene devices, such as, but not limited to, transistors, diodes, integrated circuits, and circuit traces. The fabrication method is not tied to a particular device design, can easily accommodate existing and new graphene device designs, is scalable for large quantities of graphene devices, and is compatible with existing semiconductor fabrication steps.

In step 32, graphene not protected by the remaining photoresist pattern is removed. This may be accomplished, in some embodiments, with a plasma etch. Embodiments using a plasma etch could also use the plasma etch as part of the photoresist patterning process to remove the photoresist residue that did not form a protective coating. In step 34, the thin film growth substrate not protected by the remaining photoresist pattern is removed. This may be accomplished in some embodiments with continually refreshed etch solution. Suitable etch solutions for the type of thin film growth substrate are known to those skilled in the art. As part of this step, the solution may be applied long enough to remove portions of the thin film growth substrate under the edges of the photoresist pattern. This can be useful in some embodiments, for example, if it is desirable to completely remove the thin film growth substrate from beneath a strip or section of graphene. In step 36, at least part of the remaining photoresist pattern is removed, for example, using an appropriate solvent which can easily be selected by those skilled in the art. Although not strictly necessary, in some embodiments, it may be advantageous to remove the remaining photoresist pattern last since experimental data has indicated that the remaining graphene sheet is less likely to become damaged when the remaining photoresist layer is removed last.

FIGS. 2A-2G schematically illustrate fabrication steps from a cross-sectional viewpoint, in tested embodiments of the fabrication method discussed above. FIGS. 3A-3G correspond to FIGS. 2A-2G, respectively, and illustrate the fabrication steps from a corresponding perspective view. Although the following discussion will refer to FIGS. 2A-2G for simplicity, corresponding reference may also be made to FIGS. 3A-3G if a different perspective is desired. It should be noted, however, that each set of FIGS. 2A-2G and FIGS. 3A-3G illustrate the embodiment of a transfer-free batch fabrication method for SLG devices sufficiently on its own.

Figure 2A:
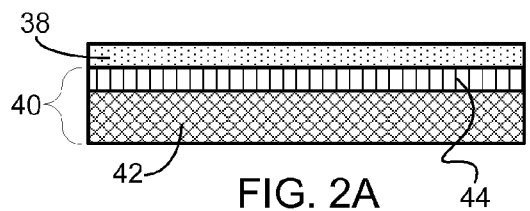
FIGS. 2A-2G schematically illustrate fabrication steps from a cross-sectional viewpoint, in an embodiment of a method of manufacturing a graphene device.
Figure 3A:
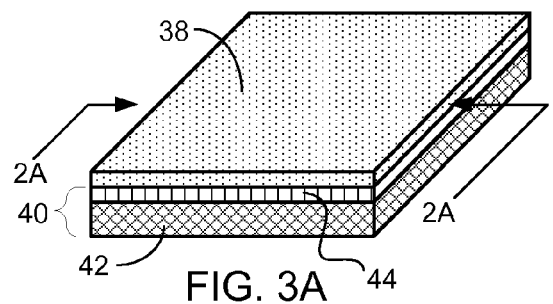
FIGS. 3A-3G correspond to FIGS. 2A-2G, respectively, and schematically illustrate the fabrication steps from a perspective view for the embodied method of manufacturing a graphene device shown in FIGS. 2A-2G.

FIG. 2A schematically illustrates the formation of a thin film growth substrate 38 directly on a device substrate 40. In this embodiment, the device substrate 40 includes a silicon layer 42 and a silicon dioxide layer 44. As discussed above, however, other embodiments may use one or more different materials for a device substrate and have fewer or more layers. Several experiments were conducted where the thin film growth substrate 38 formed directly on the device substrate 40 was a copper film of varying thickness, some embodiments with a thin nickel adhesion layer, both directly evaporated onto the device substrate 40. Before graphene growth, strips of the tested wafers were immersed in acetic acid at 35° C. for 10 min in order to remove most of the copper oxide from the thin film growth substrate 38. Even though the copper oxide would be stripped under the reaction environment, removal prior to growth eliminates the need for a lengthy anneal which can deteriorate the quality of the copper film 38. We found that one of the key variables is the thickness of the thin film growth substrate 38 (in these embodiments, the copper film 38). While graphene grows continuously on copper films thicker than 500 nm, poor film quality at high temperatures for thinner copper films prohibits such growth. Preferably, the thin film growth substrate is about 100 nm or greater in thickness, however other embodiments may form thinner or thicker thin film growth substrates directly on the device substrate. For these described tests, 500 nm thick copper was used as the thin film growth substrate 38. An approximately 5 nm layer of nickel was added as an adhesion layer for subsequent fabrication procedures to improve the adhesion of the copper to the device substrate, but the nickel adhesion layer did not adversely affect the quality of the grown graphene as confirmed by Raman spectroscopy. Different embodiments may or may not include an adhesion layer in the thin film growth substrate 38.

Figure 2B:
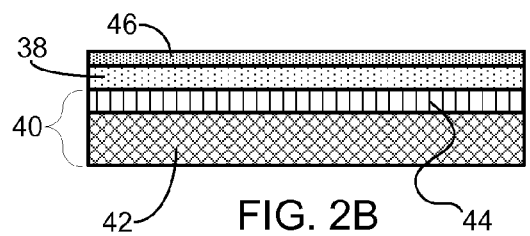
Figure 3B:
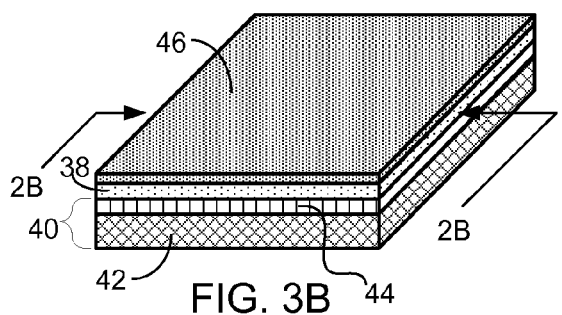

As illustrated in FIG. 2B, graphene 46 is formed on the thin film growth substrate 38. In this embodiment, the graphene growth was performed in a low pressure chemical vapor deposition system after the above-described immersion in acetic acid at 35° C. for 10 minutes. The samples were then exposed to approximately 50-200 standard cubic centimeters per minute (sccm) hydrogen ($H_2$) at ~2 Torr while heating to a growth temperature of 1000° C. at a rate of approximately 40° C. per minute. Graphene growth was carried out for approximately 10-20 minutes at 1000° C. under 200 sccm $H_2$ and 875 sccm $CH_4$ (methane) at ~11 Torr, after which the system was slowly cooled at a rate of approximately 20° C. per minute without altering the gas flow. In these embodiments, after reaching approximately 200° C., the system was purged and pressurized with approximately 1000 sccm of argon.

Figure 2C:
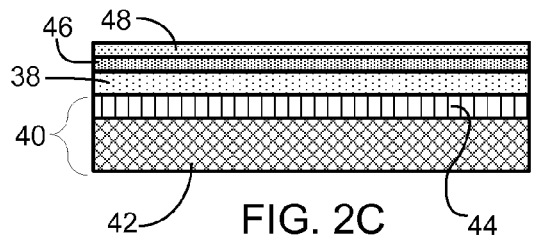
Figure 3C:
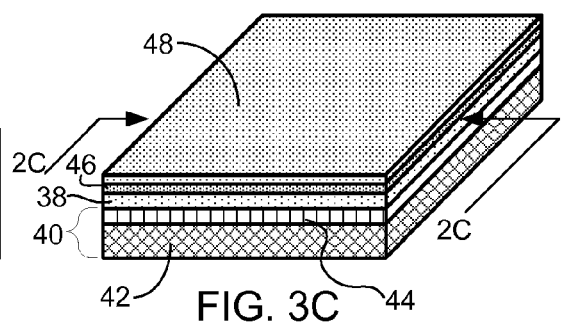
Figure 2D:
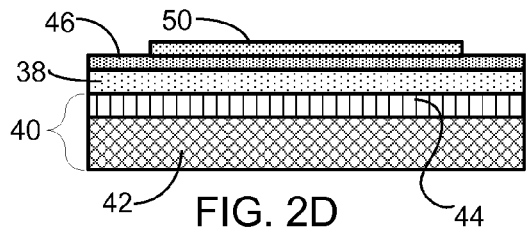
Figure 3D:
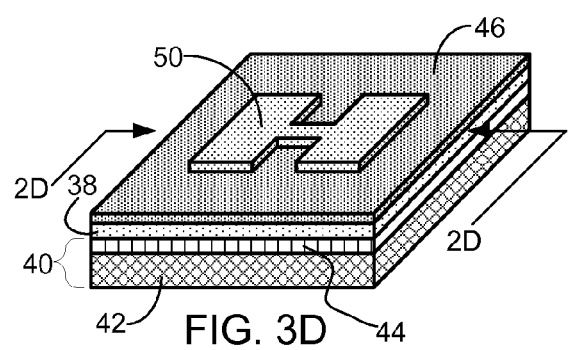
Figure 2E:
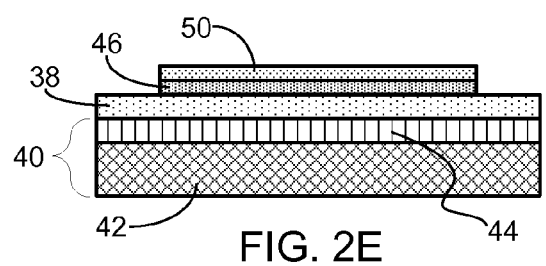
Figure 3E:
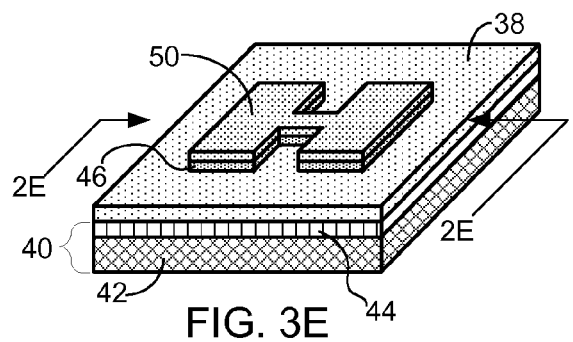
Figure 2F:
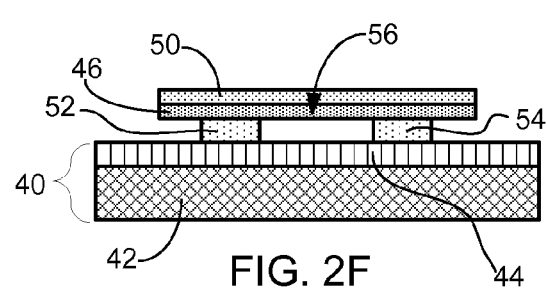
Figure 3F:
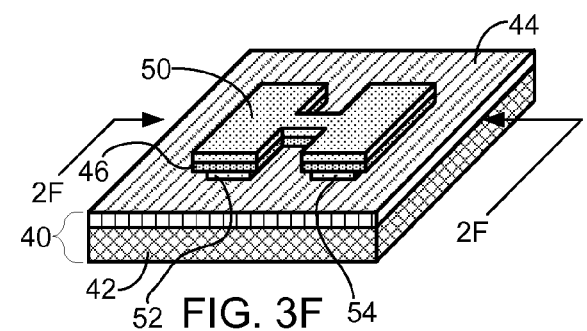
Figure 2G:
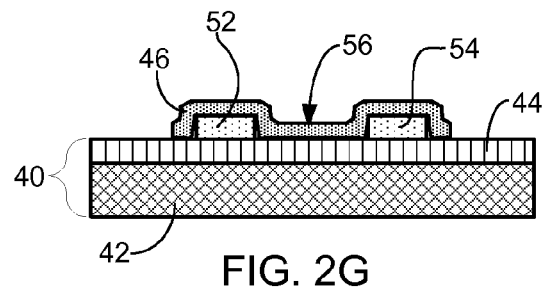
Figure 3G:
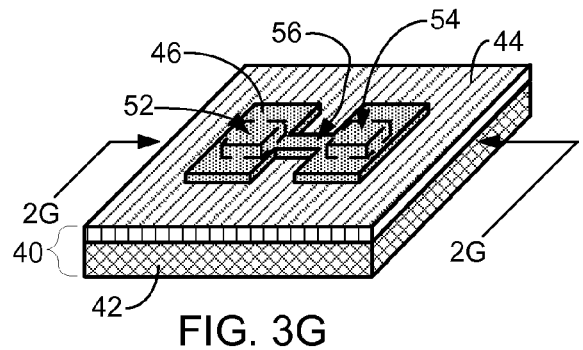

As illustrated in FIG. 2C, at least a portion of the graphene 46 is coated with a photoresist layer 48, for example by using a spin coating process. Using a photolithography process, the photoresist layer 48 was patterned to define a SLG device under a remaining photoresist pattern 50 schematically illustrated in FIG. 2D, and perhaps better shown in FIG. 3D. In this embodiment, the SLG device defined by the remaining photoresist pattern 50 includes two large pads connected by a thin strip. The remaining photoresist pattern 50, covering the devices, acts as a protective layer for the remaining processes. In the experimental embodiments, the samples were subjected to a brief (~30 second) oxygen plasma etch (60 mTorr, 50 sccm $O_2$, and 150 W RF power) to remove unwanted photoresist residue and graphene, resulting in the structure illustrated in FIG. 2E, where patterned photoresist and graphene layers 50 and 46 sit atop the thin film growth substrate 38. Whole samples were then exposed to a continually refreshed etch solution long enough to remove the thin film growth substrate (in these embodiments, copper/nickel) from the unprotected areas, including under the edges of the photoresist and beneath the connecting photoresist/graphene strips. In this embodiment, the etch solution used was a dilute solution of $FeCl_3$:$HCl$:$H_2O$. To produce the solution, $FeCl_3$:$H_2O$ was combined with concentrated HCl and deionized $H_2O$ in a ratio of 3.5 g:10 mL:100 mL. This etch solution provided accurate control of the Cu/Ni undercut while maintaining a reasonable etch rate. Other embodiments, however, may use other etch solutions selected by those skilled in the art. In the experiments, immediately following this etch, the substrates were gently flushed with deionized water for several seconds. Samples were then carefully blown dry with nitrogen before being placed in a vacuum chamber and heated to approximately 70° C. for 15 minutes. As illustrated in FIG. 2F/3F, this results in two pads 52, 54 of Cu/Ni covered by graphene 46 and connected by a channel 56 of the SLG 46 all protected by the remaining photoresist pattern 50. Lastly, in this embodiment, the photoresist was stripped (for example, using acetone and a subsequent isopropyl alcohol rinse), as illustrated in FIG. 2G, leaving the graphene channel 56 resting on the device substrate 40 connected to the two pads 52, 54.

Thus, the aggregate of FIG. 2A/3A to FIG. 2H/3H shows the following process steps sequentially. First, forming a thin film growth substrate 44 directly on a device substrate 42. Second, forming a graphene layer 38 on the thin film growth substrate 44. Third, processing the graphene layer and the thin film growth substrate to form a patterned graphene layer 46 upon a patterned thin film growth substrate 52/54. Next undercutting the patterned thin film growth substrate 52/54 with respect to the patterned graphene layer 46 formed upon the patterned thin film growth substrate 52/54 to provide an undercut patterned thin film growth substrate 52/54 having the patterned graphene layer 46 formed upon the undercut patterned thin film growth substrate 52/54. Finally, treating the patterned graphene layer 46 formed upon the undercut patterned thin film growth substrate 52/54 to provide a treated patterned graphene layer 46 that passivates sidewalls of the undercut patterned thin film growth substrate 52/54. Within the foregoing description, use of the terminology "undercut patterned thin film growth substrate 52/54" is inherently or implicitly if not explicitly intended as, and limited to, an incomplete undercutting since if the undercutting was a complete undercutting there would be no "undercut patterned thin film growth substrate 52/54" present.

Figures 1, 4A:
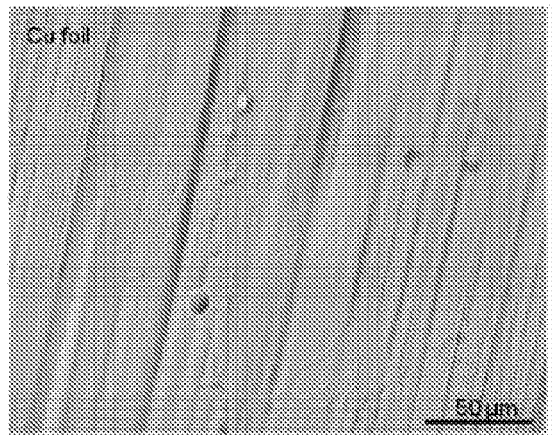
Figures 2, 4A:
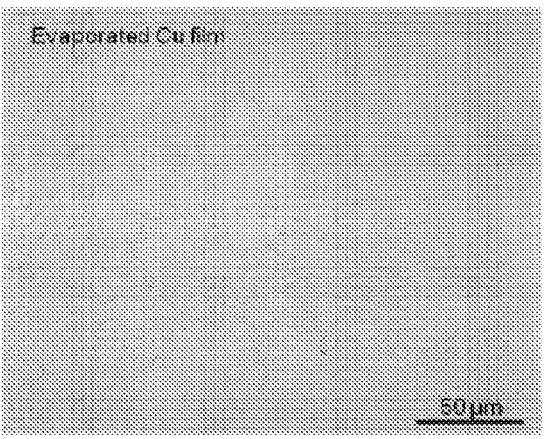

FIGS. 4A-1 and 4A-2 provide a side-by-side comparison of graphene growth on prior art copper foils (FIG. 4A-1) as compared to graphene growth on an embodiment of the thin film growth substrate (FIG. 4A-2) disclosed herein. While both growths result in visible features over the graphene surface, the average feature size is smaller for the thin film growth substrate as synthesized using an embodiment of the above methods (FIG. 4A-2). As discussed above, in some embodiments, the thin film growth substrate formed may become oxidized, and in such embodiments, metallic oxide may be present at grain boundaries if care is not taken to etch it before growth. Despite the presence of grains that are smaller than those found on copper foils, we find that graphene is continuous across these visible copper features as confirmed by Raman and electrical measurements.

Figure 4B:
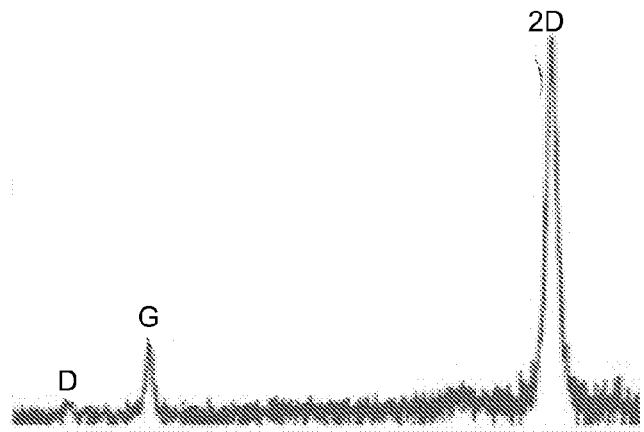
FIG. 4B shows representative Raman spectra for a manufactured graphene device after growth of a graphene layer using an embodiment of the manufacturing method discussed with regard to FIG. 1. (Copper background subtracted).

FIG. 4B shows representative Raman spectra for a manufactured graphene device after growth of a graphene layer using an embodiment of the above methods. (Copper background subtracted). A single symmetric 2D peak (full width at half-maximum ~36 cm−1), a small G/2D ratio, and a small D peak are observed, which strongly suggest that our graphene is a single layer and the quality of the sheet is not significantly affected by the visible features of the copper film.

Figure 4C:
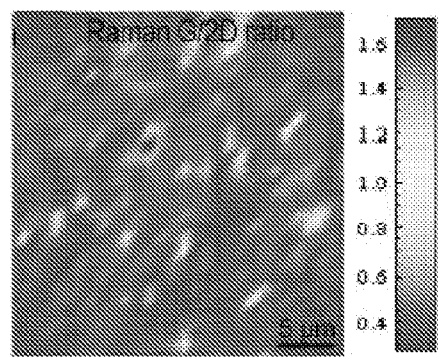
FIG. 4C shows a two-dimensional map of a G/2D ratio for graphene grown using an embodiment of the manufacturing method discussed with regard to FIG. 1, suggesting at least 93% single layer graphene coverage.

The growth of SLG was further investigated via spatially resolved 2d Raman spectroscopy. FIG. 4C shows a map of the Raman G/2D ratio that exhibits consistently small values (0.40±0.06) except for a few localized spots. From a histogram of the G/2D ratio we estimate the SLG coverage to be a minimum of 93% in these experimental embodiments. The counts for the D peak were universally low and did not present any visible structures, which is consistent with high quality graphene synthesis. Experimentally, it was also noted that if an oxide forms on the thin film growth substrate, it is beneficial to strip the oxide beforehand (as discussed above), to increase the quality of the SLG. Similarly, even slight leaks into the reaction chamber should be avoided, or the quality of the SLG may be reduced considerably.

The fabrication methods disclosed above, and their equivalents, enable the simultaneously production of a large array of devices. Significantly, testing has shown that resulting graphene channels have uniform Raman signatures even over large areas. The surface of SLG device channels, formed with the above processes, are very clean without any visible residue underneath the channels, an important improvement over devices produced by a wet transfer process.

Figure 5A:
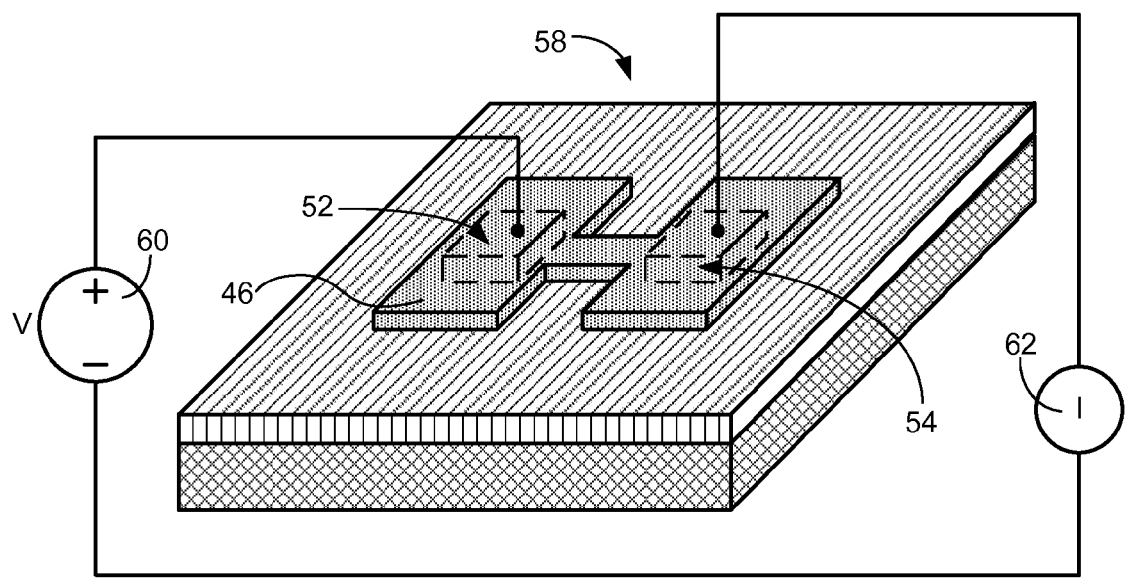
FIG. 5A schematically illustrates an embodiment of a single layer graphene device having patterned electrodes contacting the graphene from below and being tested for resistance properties.
Figure 5B:
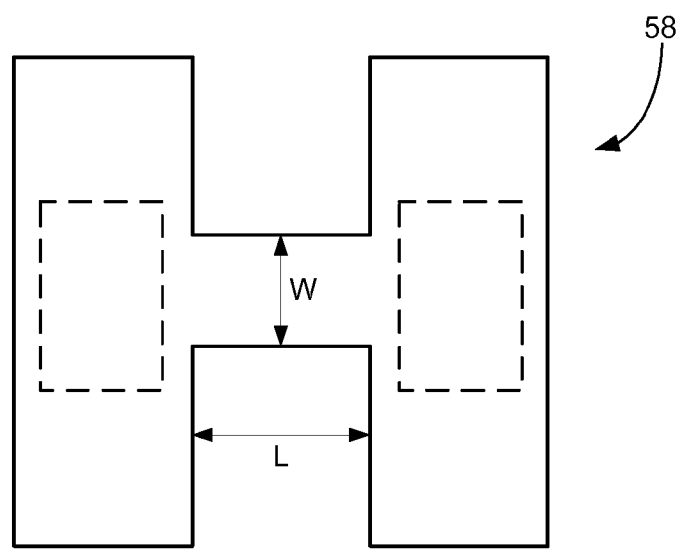
FIG. 5B schematically illustrates a top view of the graphene device of FIG. 5A to illustrate a width and a length of the graphene device.

FIG. 5A illustrates a schematic for a single device 58. FIG. 5A also schematically illustrates how this embodiment of a single layer graphene device 58, having patterned electrodes 52, 54 contacting the graphene 46 from below, may be tested for resistance properties, for example, by coupling to a variable voltage source 60 and measuring current with an amp meter 62. FIG. 5B schematically illustrates a top view of the graphene device 58 of FIG. 5A to illustrate a width (W) and a length (L) of the graphene device 58.

Figure 6A:
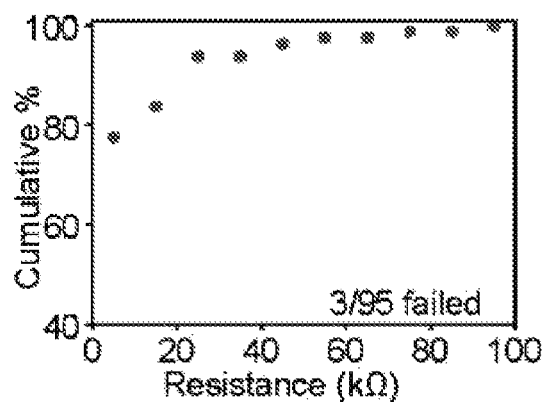
FIG. 6A is a cumulative probability plot of device resistance for a variety of SLG devices produced using an embodiment of the manufacturing method discussed with regard to FIG. 1.
Figure 6B:
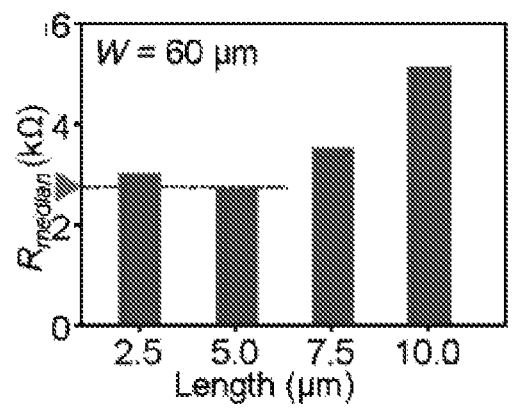
FIG. 6B is a graph of median resistance ($R_{median}$) for a variety of SLG devices produced using an embodiment of the manufacturing method discussed with regard to FIG. 1.
Figure 6C:
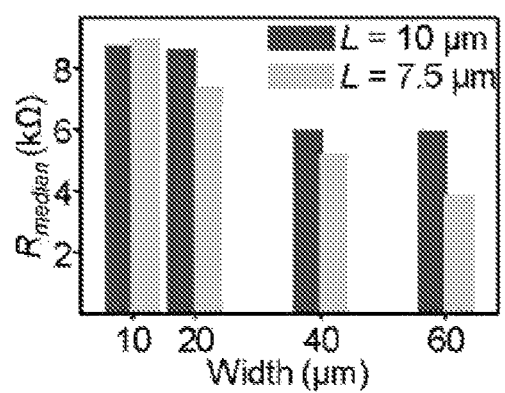
FIG. 6C is a graph of median resistance ($R_{median}$) for a variety of SLG devices produced using an embodiment of the manufacturing method discussed with regard to FIG. 1.
Figure 6D:
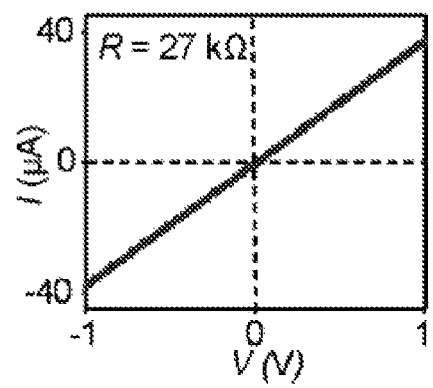
FIG. 6D is a graph of current versus voltage for an SLG device.

Some key advantages of the fabrication methods described above are high yields and uniform electrical properties. As a demonstration of this, 95 devices were fabricated on a single substrate over a large area (~3-6 mm) with varying channel lengths (L) and widths (W). Only 3 out of 95 devices were visibly broken, while the remaining 92 devices were conductive, representing a 97% success rate. Two terminal resistance measurements, as schematically illustrated in FIG. 5A, showed that nearly 80% of conducting devices have resistances of less than 10 kΩ, as shown in the cumulative probability plot for device resistance illustrated in FIG. 6A. Additionally, it was observed that median device resistance ($R_{median}$) increases with increasing channel length and decreasing channel width (See FIGS. 6B and 6C). From this data, it was estimated that the sheet resistivity of the experimental SLG was 25 kΩ with total contact resistance on the order of 3 kΩ (denoted by an arrow in FIG. 6B). Remarkably, it was found that the above fabrication process allows the fabrication of devices with much longer SLG channels (at least as long as 0.5 mm). One device with a 0.33 mm long channel (fabricated from a different batch) had an exceptionally low two terminal resistance of ~27 kΩ.

Experimentally, devices produced using embodiments of the above methods result in uniform Raman features and a high yield of conductive devices. This is consistent with continuous growth of SLG over a large area. The above methods also enable fabrication of more complicated devices with uniform performance characteristics over a large area, a key step toward integrating graphene into existing technology.

Figure 7:
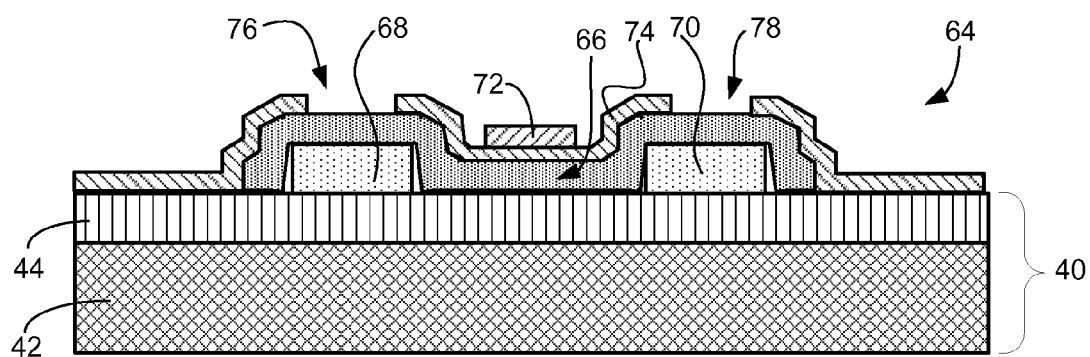
FIG. 7 schematically illustrates a cross-section of an embodiment of a transistor comprising a single layer graphene channel grown partially on and coupling a source and a drain.

FIG. 7 schematically illustrates a cross-section of an embodiment of a transistor 64 comprising a single layer graphene channel 66 grown partially on and coupling a source 68 and a drain 70. The transistor 64 is built on a device substrate 40 which includes a silicon layer 42 and a silicon dioxide layer 44 in this embodiment. The source 68 and drain 70 are supported by the device substrate 40, and may be part of a metallic growth layer as described above. Similarly, the graphene channel 66, may be formed on and connecting the source 68 and drain 70 using the previously described fabrication methods. The transistor 64 also has a gate 72 aligned with the SLG channel 66, and a gate insulator 74 between the gate 72 and the SLG channel 66. The gate insulator layer 74 may be patterned to define top contact areas 76, 78 to the graphene covered areas of the source 68 and drain 70, respectively. The gate insulator 74 may be, but is not limited to, silicon dioxide, which may be evaporated directly onto the SLG, for example by electron beam evaporation. In experimental devices, the gate insulator 74 was approximately 100 nm thick $SiO_2$, but other devices could use different thicknesses and/or materials for the gate insulator 74. In this embodiment, since the gate 72 is on top of the channel, the gate 72 may be referred-to as a top gate. The gate 72 may be formed, for example, from gold and/or chromium. In experimental devices, the gate 72 was formed from an approximately 5 nm chromium adhesion layer and approximately 45 nm of gold, although other embodiments may use other materials, fewer, or more materials, and/or different thicknesses for the gate 72. The gate 72 and gate insulator 74 may be patterned using well-known techniques, for example photolithography techniques.

Figure 8:
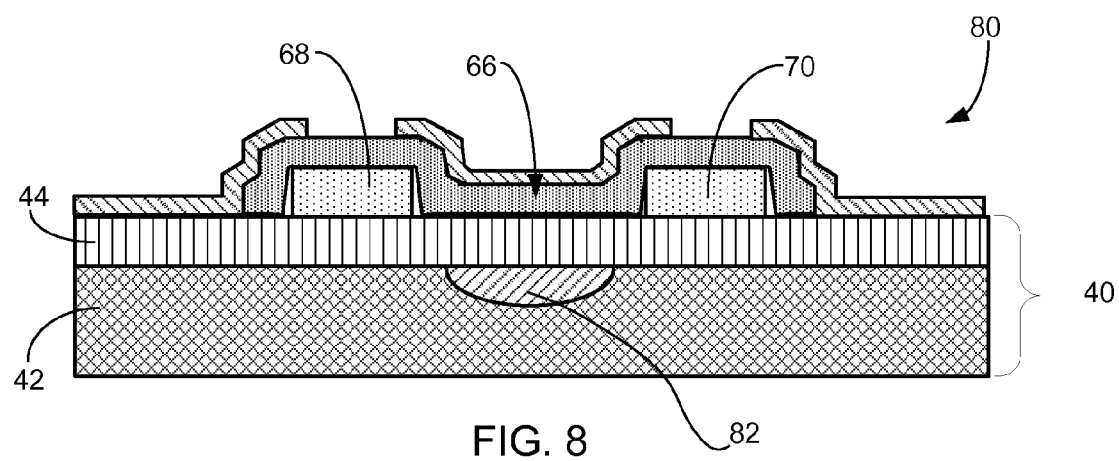
FIG. 8 schematically illustrates a cross-section of another embodiment of a transistor comprising a single layer graphene channel grown partially on and coupling a source and a drain.

Other embodiments of transistors fabricated with a SLG channel 66 using the above methods do not have to have a top gate. For example, FIG. 8 schematically illustrates a cross-section of another embodiment of a transistor 80 comprising a single layer graphene channel 66 grown partially on and coupling a source 68 and a drain 70. The transistor of FIG. 8, however, has a bottom gate 82 made from a doped region of the silicon 42 in the device substrate 40. In this embodiment, the insulating layer, such as the silicon dioxide 44 of the device substrate 40 can act as the gate insulator.

Figure 9A:
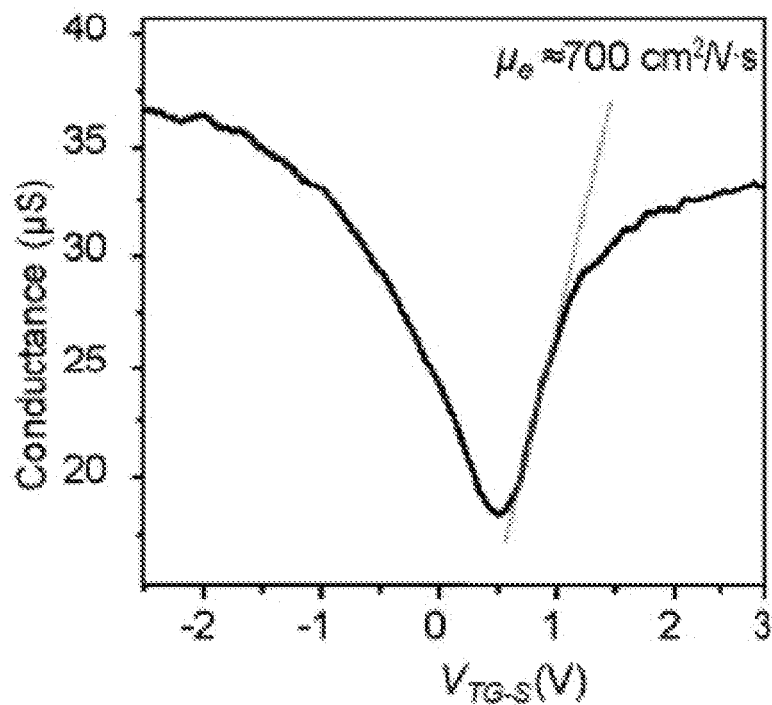
FIG. 9A shows gate dependence for an embodiment of the transistor illustrated in FIG. 7.

An embodiment of a top gate transistor fabricated using the disclosed methods was tested. In FIG. 9A, the low bias conductance, $g_{DS}$, as a function of the top gate bias ($V_{TG-S}$) measured from one of our devices is shown. The minimum conductance was observed near $V_{TG-S}$=0.5 V, which corresponds to the Fermi level being at the Dirac point of the SLG. The electron mobility was estimated to be approximately 700 $cm^2/V \cdot s$ using $1/C_{TG} \cdot (dg_{DS}/dV_{TG-S})$, where $C_{TG}$ is the top gate capacitance. The true value can be larger if we consider the fact that the actual top gate capacitance tends to be smaller than the ideal value of 34.5 $nF/cm^2$ for 100 nm $SiO_2$ used in our estimate.

Figure 9B:
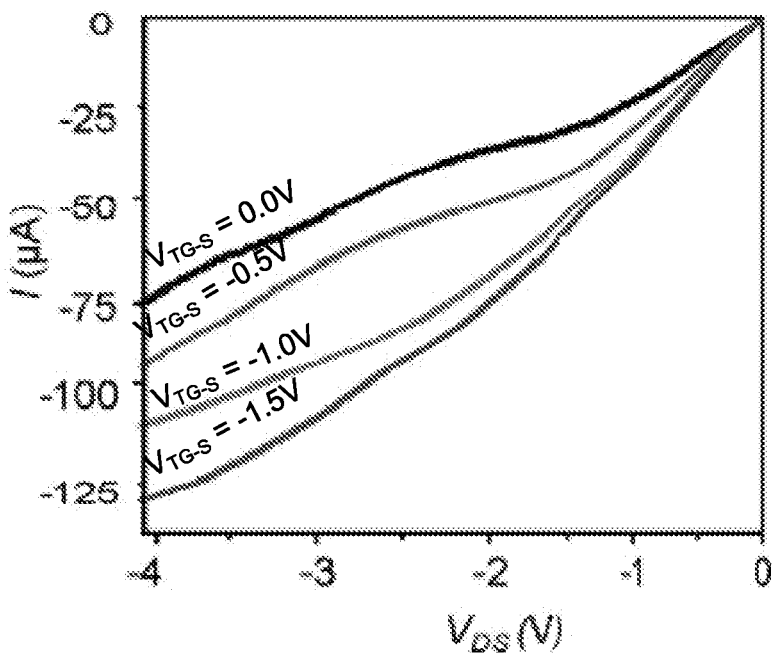
FIG. 9B shows saturation current observed for negative drain-source bias ($V_{DS}$) for an embodiment of the transistor illustrated in FIG. 7.

Similar current saturation was observed from many of our devices at relatively low $V_{DS}$. Data from the same device in FIG. 9A is shown in FIG. 9B. As $V_{TG-S}$ is decreased, regions of current saturation become more prominent with a transconductance of at least 8 µS per 1 µm of channel width. Embodiments using a thinner (for example, 20 nm) and more efficient gate insulator, such as $HfO_2$, could therefore increase the transconductance by a factor of 20.

Figure 10A:
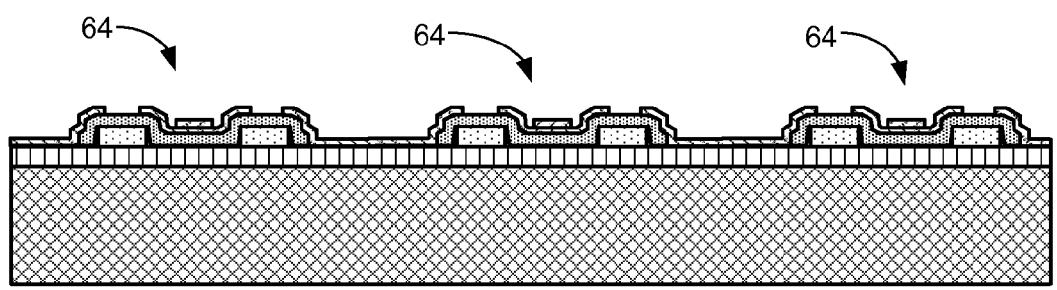
FIGS. 10A and 10B schematically illustrate cross-sections for different embodiments of an integrated circuit.
Figure 10B:
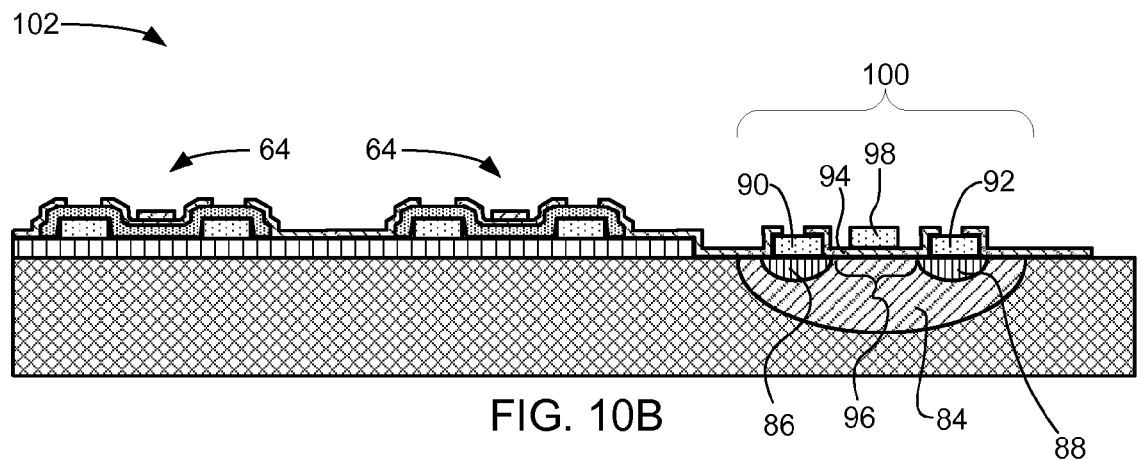

As discussed above, the SLG synthesis and device fabrication methods discussed herein are compatible with standard thin film technologies and do not involve delicate steps such as liquid based transfer. Therefore, the methods allow SLG to be integrated into large scale electronics circuitry. FIGS. 10A and 10B schematically illustrate cross-sections for different embodiments of an integrated circuit having a plurality of transistors 64 which have been described and discussed above. The transistors 64 may be patterned into a variety of integrated circuit devices, such as, but not limited to microprocessors, memory, logic gates, counters, buffers, flip flops, registers, and application specific integrated circuits (ASICs). Architectures for such integrated circuits are well-known, and those skilled in the art can use the disclosed fabrication methods produce integrated circuits having a plurality of the disclosed transistors. As FIG. 10B illustrates, the integrated circuits are not limited to exclusively graphene channel transistors 64. Instead, portions of the device substrate 40 may be doped with a first type of semiconductor to create a bulk semiconductor region 84. Then, for example, one or more source regions 86 and one or more drain regions 88 may be doped with a second type of semiconductor to create one or more source and drain pairs. A source electrode 90 and a drain electrode 92 may be formed over the respective source and drain regions 86, 88, and a gate insulator 94 may be formed over a channel region 96 in the bulk semiconductor 84. A gate electrode 98 may then be formed over the gate insulator 94. The resultant transistor 100 is a conventional field effect transistor (FET), which further illustrates that an integrated circuit 102 may be fabricated with graphene channel transistors 64 in a manner that is compatible with conventional semiconductor fabrication, and may even include conventional types of transistors, such as, but not limited to FETs.

Among other distinguishing elements, the disclosed SLG devices and methods for their manufacture include a thin film (such as, but not limited to an evaporated copper film) instead of a copper foil. This is a significant technological improvement and enables direct fabrication of uniform transistor arrays without a transfer process. The disclosed fabrication methods, and their equivalents, lead to a low device failure rate (<5% in some embodiments) and uniform electrical properties. The disclosed SLG devices have (1) a good carrier mobility, (2) mechanical and electrical continuity over a large distance (>0.5 mm), and (3) current saturation and a promising transconductance (~8 µS/µm). Furthermore, the disclosed techniques are easily scalable to larger dimensions, limited only by the size of the substrate and growth chamber. As an additional benefit, the disclosed fabrication methods are compatible with existing thin film technologies.

Figure 11:
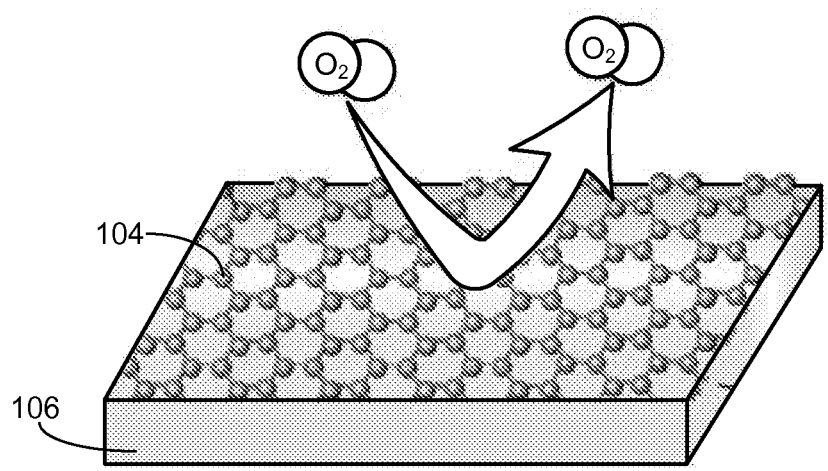
FIG. 11 schematically illustrates that graphene is an effective barrier against oxidation and diffusion.
Figure 12A:
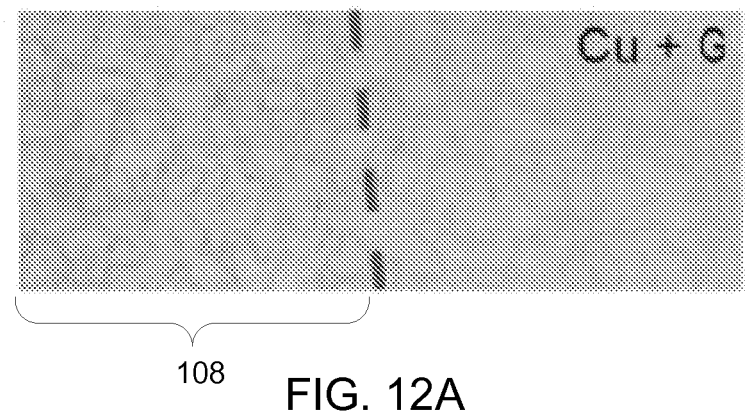
FIG. 12A shows a Brightfield image of evaporated copper film with graphene, where a portion of the copper film has been exposed to hydrogen peroxide.
Figure 12B:
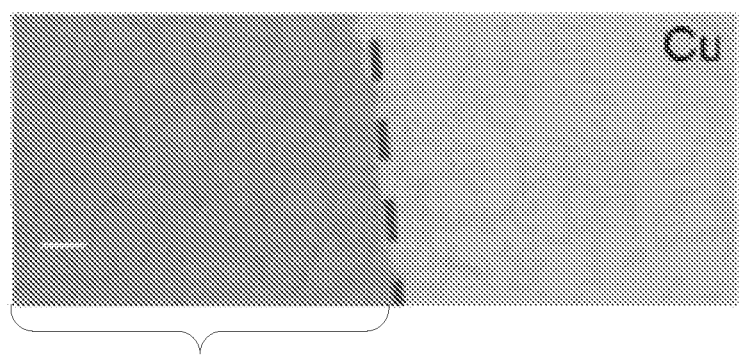
FIG. 12B shows a Brightfield image of a copper film without graphene, where a portion of the copper film has been exposed to hydrogen peroxide.

As schematically illustrated in FIG. 11, further benefits for fabrication of devices may be realized by using graphene 104 as an atomically thin diffusion barrier to prevent oxidation or etching of underlying metal substrates 106. In fabrication experiments utilizing graphene, test data shows that graphene is an effective barrier against hydrogen peroxide ($H_2O_2$) and nitric acid ($HNO_3$), and graphene's resistance to a wide variety of other metal etchants/oxidants, such as oxygen gas ($O_2$), aqua regia (~1:4 volume ratio of $HNO_3$:HCl), sulfuric acid ($H_2SO_4$), and several other acid solutions has been observed. For example, FIG. 12A shows a Brightfield image of evaporated copper film (500 nm thick for this experiment) with graphene, while FIG. 12B shows an image of a similar copper film without graphene. A portion 108 of the copper film protected by graphene and a portion 110 of the copper film without graphene were exposed to $H_2O_2$ (30%, for 2 minutes). The graphene protected film exhibited strong resistance to the oxidizing agent, whereas the unprotected metal was significantly affected. While graphene formed on a thin film growth substrate was found to act as an effective diffusion/oxidation barrier, it is also believed that transferred graphene may also offer similar protection to underlying surfaces. While it is preferred to utilize graphene formed on a thin film growth substrate as described in the numerous embodiments above, especially when forming SLG devices, for the purposes of using graphene as a protective layer, either graphene formed directly on a substrate or transferred graphene may be effective as an oxidation/diffusion barrier.

Figure 13:
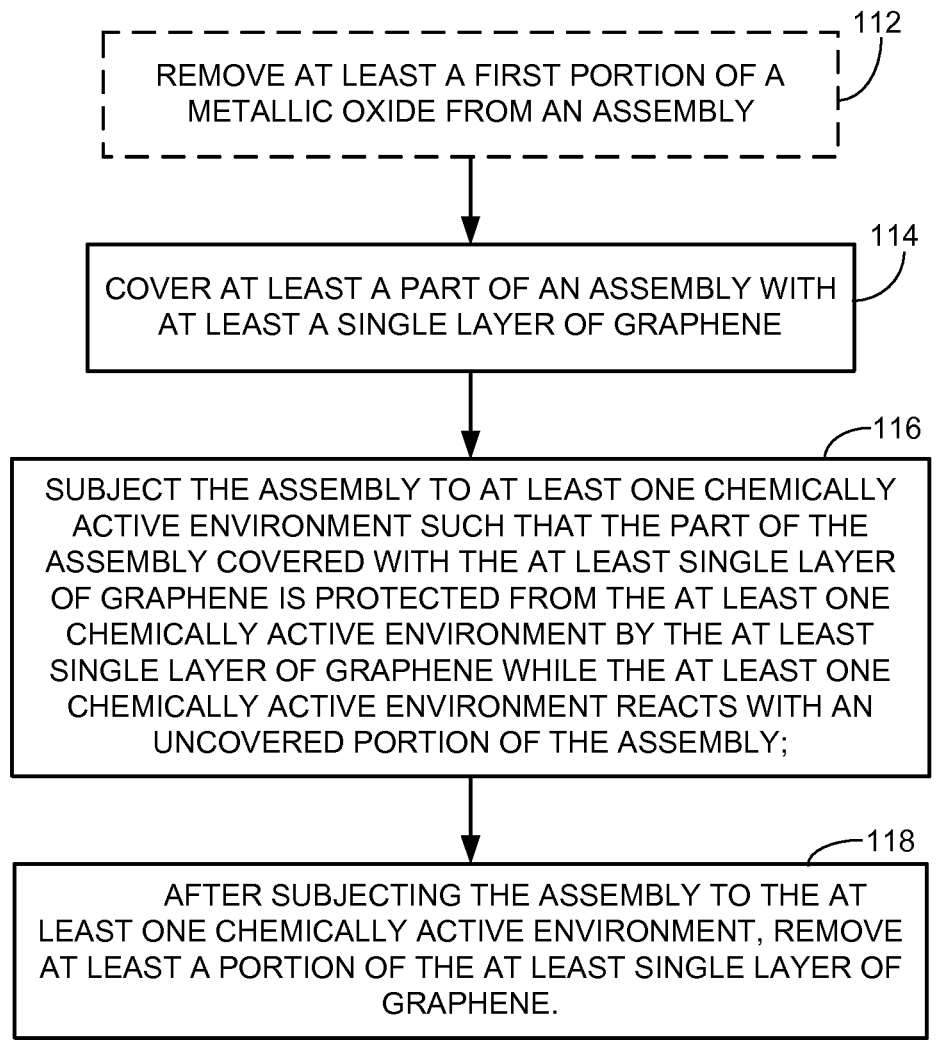
FIG. 13 illustrates one embodiment of a fabrication method.

Many fabrication processes utilize chemically active environments, for example, to oxidize or etch a fabrication assembly. It is often desirable to provide a way for the chemically active environment to selectively react with some portions of the assembly, while protecting other portions of the assembly from reaction with the chemically active environment. FIG. 13 illustrates one embodiment of a fabrication method for an assembly. Depending on the embodiment, the assembly may comprise one or more of the following: a thin film growth substrate, a semiconductor, one or more micro-electro-mechanical-system (MEMS) components (such as, but not limited to a comb filter, a resonator, and an oscillator), one or more circuit traces, one or more transistor components, a mechanical part (such as, but not limited to gears, lifters, cams, brackets, frames, auto bodies, engine blocks, and keys), an article to be worn (such as, but not limited to jewelry, buttons, snaps, frames for glasses, and watches), and glass. Many other examples of possible assembly items exist and will be apparent to those skilled in the art. If one or more portions of the assembly are metal, in an optional step 112, at least a first portion of a metallic oxide may be removed from the assembly. As discussed above, this can improve subsequent graphene formation on the assembly. In step 114, at least a part of the assembly is covered with at least a single layer of graphene. In some embodiments, this may involve transferring previously formed graphene to the assembly. In other embodiments, covering at least a part of the assembly with at least a single layer of graphene may involve forming graphene directly on the assembly. This is possible, for example, if the portions of the assembly being covered with graphene already have a thin film growth substrate, such as those discussed previously, or if the portion of the assembly being covered with graphene are made from a substance which graphene can be grown on, such as, but not limited to copper, nickel, cobalt, ruthenium, iridium, or transition metals. If the graphene is formed on the assembly, then this may be done, for example, with a chemical vapor deposition (CVD) process as discussed in the embodiments above.

Some assemblies may not inherently be made from a substance which graphene can be grown on, or the assembly may not have a thin film growth substrate. In such cases, a thin film growth substrate may be formed on at least part of the assembly, and then graphene may be formed on the thin film growth substrate as part of the step 114 to cover at least a part of the assembly with at least a single layer of graphene in some embodiments. As non-limiting examples, a thin film growth substrate may be formed on the assembly using the thin film growth substrate formation methods discussed above.

In step 116, the assembly is subjected to at least one chemically active environment such that the part of the assembly covered with the at least single layer of graphene is protected from the at least one chemically active environment by the at least single layer of graphene while the at least one chemically active environment reacts with an uncovered portion of the assembly. As non-limiting examples, the at least one chemically active environment could include one or more of a gas, a liquid, a temperature, a pressure, oxygen, hydrogen peroxide, nitric acid, aqua regia, sulfuric acid, and an acidic solution.

In step 118, after subjecting the assembly to the at least one chemically active environment, at least a portion of the at least single layer of graphene is removed. The portion of the assembly which was protected by the graphene may then be treated or used in subsequent fabrication steps, or left as-is.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. As just one example, although the disclosed fabrication techniques have been discussed in the context of manufacturing SLG devices such as transistors and integrated circuits, there may be a variety of other types of apparati which may include SLG grown on a thin film growth substrate formed directly on a device substrate. Therefore, types of apparati are not limited to transistors and integrated circuits. Other non-limiting potential applications for grown graphene coatings include: inert coatings, anti-corrosive coatings, graphene biodevices, transparent conducting electrodes, and conductive plates for ultra capacitors. Since graphene is resistant to attack from many acids and alkalis, it can be used to provide an inert coating on substances. Due to graphene's two-dimensional structure, large surface area and functionalizable properties, it is an efficient substrate for the detection of molecules. Therefore graphene could also be a good source for detection and diagnosis in the medical field. Graphene could be used as transparent conducting electrodes for devices such as touch screens, liquid crystal displays, organic photovoltaic cells, and/or organic light emitting diodes. Graphene's incredibly large surface area per unit mass (approximately 2630 $m^2/g$) can enable graphene to be used in one or more layered plates to provide greater energy storage capacities than are currently available, even when compared to ultra capacitors.

Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A method of manufacturing one or more graphene devices, comprising:
   forming a thin film growth substrate directly on a device substrate;
   forming a graphene layer on the thin film growth substrate;
   processing the graphene layer and the thin film growth substrate to form a patterned graphene layer upon a patterned thin film growth substrate; and
   undercutting the patterned thin film growth substrate with respect to the patterned graphene layer formed upon the patterned thin film growth substrate to provide an undercut patterned thin film growth substrate having the patterned graphene layer formed upon the undercut patterned thin film growth substrate.

2. The method of claim 1, wherein the device substrate comprises silicon.

3. The method of claim 2, wherein the device substrate further comprises silicon dioxide.

4. The method of claim 1, wherein the device substrate comprises a semiconductor.

5. The method of claim 1, wherein the device substrate comprises a material selected from the group consisting of glass, fused silica, quartz, sapphire, and a metal.

6. The method of claim 1, wherein the thin film growth substrate comprises copper.

7. The method of claim 6, wherein the thin film growth substrate further comprises a nickel adhesion layer.

8. The method of claim 1, wherein the thin film growth substrate comprises an element selected from the group consisting of nickel, cobalt, ruthenium, iridium; and a transition metal.

9. The method of claim 1, wherein the thin film growth substrate comprises a plurality of thin film growth substrate areas which are not continuous with each other.

10. The method of claim 1, wherein the thin film growth substrate has a prepatterned structure.

11. The method of claim 1, wherein forming the thin film growth substrate directly on the device substrate comprises evaporating the thin film growth substrate directly on the device substrate.

12. The method of claim 1, wherein forming the thin film growth substrate directly on the device substrate comprises sputtering the thin film growth substrate directly on the device substrate.

13. The method of claim 1, wherein forming the thin film growth substrate directly on the device substrate comprises electroplating the thin film growth substrate directly on the device substrate.

14. The method of claim 1, wherein the thin film growth substrate has a thickness of at least approximately 100 nanometers.

15. The method of claim 1, further comprising removing at least a first portion of a metallic oxide from the thin film growth substrate before forming graphene on the thin film growth substrate.

16. The method of claim 15, wherein removing at least the first portion of the metallic oxide from the thin film growth substrate comprises immersing the thin film growth substrate in an acidic reagent configured to react with and remove oxygen atoms of the metallic oxide.

17. The method of claim 16, wherein the acidic reagent comprises an acetic acid.

18. The method of claim 17, wherein immersing the thin film growth substrate in the acidic reagent comprises immersing the thin film growth substrate in the acetic acid for approximately ten minutes at a temperature of approximately 35 degrees Celsius.

19. The method of claim 1, wherein forming graphene on the thin film growth substrate comprises forming graphene on the thin film growth substrate in a chemical vapor deposition (CVD) process.

20. The method of claim 19, wherein the CVD process comprises: heating the thin film growth substrate for approximately 20 minutes at approximately 1000 degrees Celsius in a growth environment of approximately 200 standard cubic centimeters per minute (sccm) hydrogen (H.sub.2) and approximately 875 sccm methane (CH.sub.4) at a pressure of approximately 11 Torr.

21. The method of claim 19, wherein forming graphene on the thin film growth substrate comprises forming a substantially single layer of graphene on the thin film growth substrate.

22. A method of manufacturing one or more graphene devices, comprising:
forming a thin film growth substrate directly on a device substrate;
forming a graphene layer on the thin film growth substrate;
processing the graphene layer and the thin film growth substrate to form a patterned graphene layer upon a patterned thin film growth substrate;
coating at least a portion of the graphene with a photoresist layer;
patterning the photoresist layer to define the one or more graphene devices under a remaining photoresist pattern;
removing graphene not protected by the remaining photoresist pattern;
removing the thin film growth substrate not protected by the remaining photoresist pattern; and
removing at least part of the remaining photoresist pattern.

23. The method of claim 22, wherein at least one of the defined one or more graphene devices comprises a pair of pads connected by a graphene channel.

24. The method of claim 23, wherein, after removing graphene and thin film growth substrate not protected by the remaining photoresist pattern: each pad in the pair of pads for the at least one of the one or more graphene devices comprises a remaining area of the thin film growth substrate.

25. The method of claim 22, wherein patterning the photoresist layer to define one or more graphene devices under the remaining photoresist pattern comprises removing unwanted photoresist residue from the photoresist layer.

26. The method of claim 25, wherein removing unwanted photoresist residue from the photoresist layer comprises plasma etching the unwanted photoresist residue.

27. The method of claim 26, wherein plasma etching the unwanted photoresist residue also removes said graphene not protected by the remaining photoresist pattern.

28. The method of claim 22, wherein removing said thin film growth substrate not protected by the remaining photoresist pattern comprises exposing the thin film growth substrate to an etch solution.

29. The method of claim 22, wherein said removing at least part of the remaining photoresist pattern occurs after the thin film growth substrate is removed.

30. The method of claim 1, further comprising treating the patterned graphene layer formed upon the undercut patterned thin film growth substrate to provide a treated patterned graphene layer that passivates sidewalls of the undercut patterned thin film growth substrate.

31. An apparatus, comprising
a device substrate;
a patterned thin film growth substrate formed directly on at least a portion of the device substrate and comprising at least two patterned thin film growth substrate pads which include sidewalls; and
a patterned graphene layer formed directly on at least a portion of the patterned thin film growth substrate, including the at least two patterned thin film growth substrate pads, the patterned thin film growth substrate being undercut in comparison with the patterned graphene layer which extends beyond the sidewalls of the at least two patterned thin film growth substrate pads and bridges between the at least two patterned thin film growth substrate pads and which also passivates the sidewalls of the at least two patterned thin film growth substrate pads.

32. The apparatus of claim 31, wherein the device substrate comprises silicon.

33. The apparatus of claim 32, wherein the device substrate further comprises silicon dioxide.

34. The apparatus of claim 31, wherein the device substrate comprises a semiconductor and an insulator.

35. The apparatus of claim 31, wherein the device substrate comprises a material selected from the group consisting of glass, fused silica, quartz, sapphire, and a metal.

36. The apparatus of claim 31, wherein the thin film growth substrate comprises copper.

37. The apparatus of claim 36, wherein the thin film growth substrate further comprises a nickel adhesion layer.

38. The apparatus of claim 31, wherein the thin film growth substrate comprises an element selected from the group consisting of nickel, cobalt, ruthenium, iridium, and a transition metal.

39. The apparatus of claim 31, wherein the thin film growth substrate comprises an evaporated metallic film.

40. The apparatus of claim 31, wherein the thin film growth substrate has a thickness of at least approximately 100 nanometers.

41. The apparatus of claim 31, wherein the thin film growth substrate comprises a plurality of thin film growth substrate areas which are not continuous with each other.

42. The apparatus of claim 31, wherein the thin film growth substrate has a prepatterned structure.

43. The method of claim 1 wherein the patterned thin film growth substrate has smaller areal dimensions in comparison with the patterned graphene layer.

44. The apparatus of claim 31 wherein the patterned thin film growth layer has smaller areal dimensions in comparison with the patterned graphene layer.

45. A method for fabricating a graphene device comprising:
    forming over a device substrate a thin film growth substrate;
    forming upon the thin film growth substrate a graphene layer;
    patterning sequentially the graphene layer and the thin film growth substrate to form a patterned graphene layer formed coextensive upon a patterned thin film growth substrate;
    undercutting the patterned thin film growth substrate with respect to the patterned graphene layer formed upon the patterned thin film growth substrate to provide an undercut patterned thin film growth substrate having the patterned graphene layer formed upon the undercut patterned thin film growth substrate; and
    treating the patterned graphene layer formed upon the undercut patterned thin film growth substrate to provide a treated patterned graphene layer that passivates sidewalls of the undercut patterned thin film growth substrate, wherein the undercutting provides a pair of patterned thin film growth substrate pads having formed thereupon the patterned graphene layer, a separation distance of the pair of patterned thin film growth substrate pads defines a graphene channel within the patterned graphene layer.

46. A graphene device comprising:
    a device substrate;
    a patterned thin film growth substrate formed directly on at least a portion of the device substrate and comprising at least two patterned thin film growth substrate pads which include sidewalls; and
    a patterned graphene layer formed directly on at least a portion of the patterned thin film growth substrate, including the at least two patterned thin film growth substrate pads, the patterned thin film growth substrate being undercut in comparison with the patterned graphene layer which extends beyond the sidewalls of the at least two patterned thin film growth substrate pads and bridges between the at least two patterned thin film growth substrate pads and which also passivates the sidewalls of the at least two patterned thin film growth substrate pads, where a separation distance of the pair of patterned thin film growth substrate pads defines a graphene channel within the graphene device.

47. The method of claim 1 wherein the method uses a single photolithographic process step.

* * * * *